(12) United States Patent
Kim et al.

(10) Patent No.: US 9,455,047 B2
(45) Date of Patent: Sep. 27, 2016

(54) MEMORY DEVICE TO CORRECT DEFECT CELL GENERATED AFTER PACKAGING

(71) Applicant: SAMSUNG Electronics Co., Ltd., Suwon-si, Gyeonggi-do (KR)

(72) Inventors: Cheol Kim, Seoul (KR); Sang-ho Shin, Yongin-si (KR); Jung-sik Kim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 533 days.

(21) Appl. No.: 13/799,967

(22) Filed: Mar. 13, 2013

(65) Prior Publication Data

US 2013/0322160 A1 Dec. 5, 2013

(30) Foreign Application Priority Data

Jun. 1, 2012 (KR) ........................ 10-2012-0059427

(51) Int. Cl.
*G11C 29/04* (2006.01)
*G11C 29/00* (2006.01)
*G11C 29/44* (2006.01)

(52) U.S. Cl.
CPC ........... *G11C 29/04* (2013.01); *G11C 29/4401* (2013.01); *G11C 29/783* (2013.01); *G11C 29/785* (2013.01); *G11C 29/787* (2013.01); *G11C 2029/4402* (2013.01)

(58) Field of Classification Search
USPC .......... 365/200, 225.7, 189.07, 189.12, 222, 365/230.06, 201
See application file for complete search history.

(56) References Cited

U.S. PATENT DOCUMENTS

| | | | |
|---|---|---|---|
| 5,917,764 A | 6/1999 | Ohsawa et al. | |
| 5,987,632 A | 11/1999 | Irrinki et al. | |
| 6,320,804 B2 | 11/2001 | Dahn | |
| 6,392,937 B2 | 5/2002 | Nagai | |
| 6,829,181 B1* | 12/2004 | Seitoh | 365/201 |
| 6,967,878 B2* | 11/2005 | Dono | 365/200 |
| 7,187,607 B2* | 3/2007 | Koshikawa | 365/222 |
| 7,742,355 B2 | 6/2010 | Kohler et al. | |
| 8,248,871 B2* | 8/2012 | Park et al. | 365/200 |
| 2003/0123301 A1* | 7/2003 | Jang et al. | 365/200 |
| 2004/0141384 A1* | 7/2004 | Keeth et al. | 365/200 |
| 2005/0207252 A1* | 9/2005 | Takahashi et al. | 365/222 |
| 2012/0051154 A1* | 3/2012 | Son et al. | 365/189.07 |
| 2012/0120733 A1* | 5/2012 | Son et al. | 365/189.02 |
| 2012/0182816 A1* | 7/2012 | Ide | G11C 29/56008 365/200 |
| 2013/0083612 A1* | 4/2013 | Son et al. | 365/200 |
| 2013/0117636 A1* | 5/2013 | Kim et al. | 714/773 |
| 2013/0163355 A1* | 6/2013 | Son et al. | 365/200 |
| 2013/0279282 A1* | 10/2013 | Kim | 365/207 |
| 2014/0029362 A1* | 1/2014 | Adham et al. | 365/200 |

FOREIGN PATENT DOCUMENTS

KR 10-0354437 9/2002

* cited by examiner

*Primary Examiner* — Kretelia Graham
(74) *Attorney, Agent, or Firm* — Muir Patent Law, PLLC

(57) ABSTRACT

A memory device to correct a defect cell generated after packing is performed includes a memory cell array in which a plurality of memory cells are arranged, a repair circuit unit including a first storage unit to store defect cell information in the memory cell array, and a fuse circuit unit including a second storage unit that is programmed according to the defect cell information stored in the first storage unit. The first storage unit includes a volatile memory device, and the second storage unit includes a non-volatile memory device.

18 Claims, 10 Drawing Sheets

US 9,455,047 B2

MEMORY DEVICE TO CORRECT DEFECT CELL GENERATED AFTER PACKAGING

CROSS-REFERENCE TO RELATED APPLICATIONS

This application claims priority under 35 U.S.C. §119 from Korean Patent Application No. 10-2012-0059427, filed on Jun. 1, 2012, in the Korean Intellectual Property Office, the disclosure of which is incorporated herein in its entirety by reference.

BACKGROUND

1. Field

The inventive concept relates to a semiconductor device, and more particularly, to a memory device to correct a defect cell generated after packaging is performed, a memory module and memory system including the memory device.

2. Description of the Related Art

After a semiconductor manufacturing process is performed, it is determined whether a memory device such as a dynamic random access memory (DRAM) is defect through tests. DRAM tests include a wafer test and a package test. In the wafer test, when defect memory cells are generated, the defect memory cells are replaced with redundant memory cells in a DRAM. However, when the defect memory cell is detected in the package test, it is impossible to replace the defect memory cell with a redundant memory cell, and thus the DRAM is finally determined to be defect. An error that occurs in the package test is likely to be a single bit error. In order to increase a manufacturing yield, there is a need to resolve a single bit error that occurs after packaging is performed.

SUMMARY

The inventive concept provides a memory device to correct a defect cell generated after packaging is performed, a memory module and memory system including the memory device.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a memory device including a memory cell array in which a plurality of memory cells are arranged, a repair circuit unit including a first storage unit to store defect cell information in the memory cell array, and a fuse circuit unit including a second storage unit to be programmed according to the defect cell information stored in the first storage unit.

The defect cell information may correspond to an address of a defect cell that is generated after packaging of the memory device is performed.

The repair circuit unit may include a first register to store a command and first data, which are applied from an external device to the memory device, a second register to store an address applied from an external device to the memory device and second data read from a memory cell corresponding to the address from the memory cell array, a comparer to compare the first data with the second data and to generate a flag signal indicating that the memory cell is a defect cell, the first storage unit to store a defect cell address in response to the flag signal, and a repair controller to sequentially generate an internal command signal and a count value from a counter in response to the command.

The first storage unit may include any one of a register, a static random access memory (SRAM), and a latch.

The fuse circuit unit may include a predecoder to decode a count value in response to an internal command signal, the second storage unit in which non-volatile devices are arranged at intersections between a plurality of word lines and a plurality of bit lines, a word line decoder to select the word lines in response to the decoded count value, and a column selecting unit to select the bit lines in response to the decoded count value, wherein the defect cell address of the first storage unit is transmitted to the bit lines.

The non-volatile device may include any one of an anti-fuse, a floating gate fuse, and a hot carrier injection fuse, which are electrically programmable.

The defect cell information may correspond to an address of a memory cell having poor refresh characteristics from among the memory cells in the memory cell array.

The repair circuit unit may include a controller to generate a refresh address in response to a command applied from outside the memory device, to control a refresh operation of the memory cell array according to the refresh address, and to determine the memory cell having one or more poor refresh characteristics as a defect memory cell during the refresh operation, and a repair controller to sequentially generate an internal command signal and a count value from a counter in response to the command.

The foregoing and/or other features and utilities of the present general inventive concept may also be achieved by providing a memory device including a memory cell array in which a plurality of memory cells are arranged to be divided into a normal cell array and a redundant cell array, a repair circuit unit to store defect cell information in the memory cell array in the redundant cell array, and a fuse circuit unit including a storage unit to be programmed according to the defect cell information that is stored in the redundant cell array.

The repair circuit unit may include a first register to store a command and first data, which are applied from an external device to the memory device, a second register to store an address applied from an external device to the memory device and second data read from a memory cell corresponding to the address from the memory cell array, a comparer to compare the first data with the second data and to generate a flag signal indicating that the memory cell is a defect cell, and a repair controller to store the defect cell information in the redundant cell array in response to the flag signal and to sequentially generate an internal command signal and a count value from a count in response to the command.

The foregoing and/or other features and utilities of the present general inventive concept may also be achieved by providing a memory device including a memory cell array in which a plurality of memory cells are arranged and a fuse circuit unit connected to the memory cell array and having a storage unit that is programmed according to defect cell information of the memory cells.

The memory device may further include a repair circuit unit to detect a defect cell during a packing process to generate the defect cell information of the defect cell, and the storage unit may be programmed to store the detect cell information.

The memory device may further include a refresh circuit unit to detect a defect cell during a refresh process to generate the defect cell information, and the storage unit may be programmed to store the detect cell information.

The memory cell array may include a normal cell array and a redundant cell array, the redundant cell array stores previous defect cell information, and the storage unit may store the defect cell information.

The foregoing and/or other features and utilities of the present general inventive concept may also be achieved by providing an electronic apparatus including a controller to control a memory device described above or hereinafter to read and write data in the memory cells.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
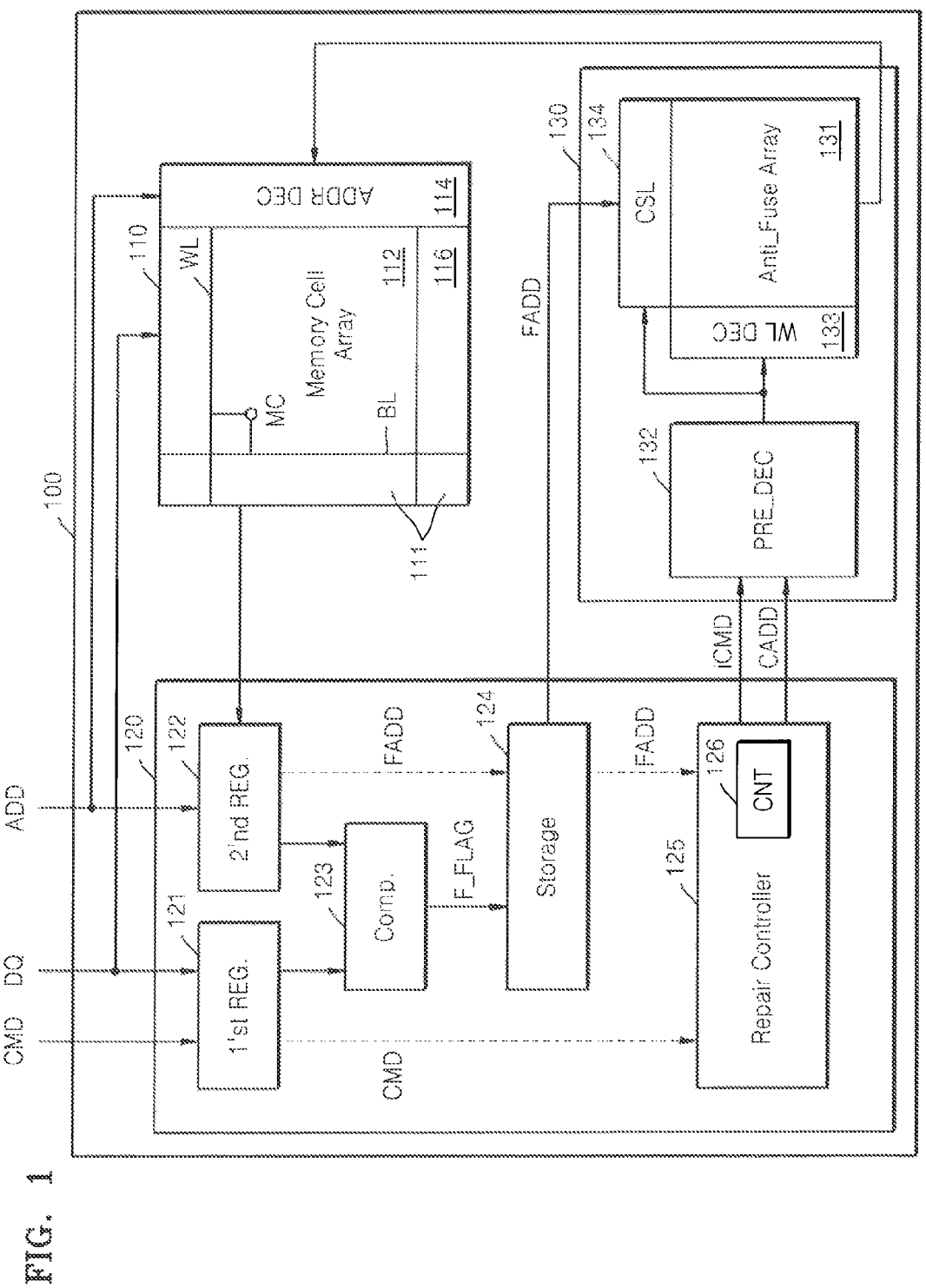
FIG. 1 is a block diagram illustrating a memory device according to an embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. The inventive concept may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art. In the drawings, the thicknesses of layers and regions are exaggerated for clarity.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A storage capacity of a semiconductor memory device has increased by virtue of the development of a manufacturing process of the semiconductor memory device. As technologies for miniaturization processes have been developed, the number of defect memory cells has increased. Defect memory cells may be replaced with redundant memory cells.

Defect addresses for addressing defect memory cells may be stored in a fuse array circuit including a plurality of program fuses. When an access to the defect addresses is requested, the fuse array circuit may be controlled to perform a replacement access to a redundant memory cell instead of a defect memory cell. The defect addresses may be detected during a test process of a memory device. The defect addresses may be stored by programming program fuses by using a method of irradiating a laser beam.

However, after the defect addresses are replaced, defect cells may be frequently generated due to a thermal stress during a packaging process. When defect cells are generated after packaging is performed, the defect addresses may not be replaced then by using a method of irradiating a laser beam.

The number of defect cells generated after packaging is performed is much smaller than the number of defect cells generated during a wafer test of a memory device. That is, an error that occurs after packaging is performed may likely be a single bit error instead of a multi bit error. Thus, if a defect cell having a single bit error is corrected to manufacture a non-defect memory device, a manufacturing yield may be increased.

FIG. 1 is a block diagram illustrating a memory device 100 according to an embodiment of the inventive concept.

Referring to FIG. 1, the memory device 100 includes a memory cell core unit 110, a repair circuit unit 120, and a fuse circuit unit 130. The memory device 100 may be a dynamic random access memory (DRAM) from among semiconductor memory devices. The memory cell core unit 110 may include a memory cell array 111 in which a plurality of memory cells MC are arranged in rows and columns, and an address decoder 114 to address the memory cells MC.

In the memory cell array 111, a plurality of word lines WL and a plurality of bit lines BL cross each other and the memory cells MC are respectively arranged at corresponding intersections between the word lines WL and the bit lines BL. The memory cells MC may each be a one-transistor, one-capacitor (1T1C) DRAM cell.

The memory cells MC included in the memory cell array 111 may be arranged divided into a normal cell array 112 and a redundant cell array 116. The capacity of the memory cells MC included in the normal cell array 112 may be contained to calculate a storage capacity of the memory device 100. The memory cell array 111 may write a data input/output signal DQ applied from an outside of the memory device 100 to a selected memory cell MC. Redundant memory cells may be arranged in the redundant cell array 116 to replace defect cells of the normal cell array 112. The redundant memory cells may be configured in the same manner as the memory cells MC of the normal cell array 112. The redundant memory cells may be replaced in units of redundant rows or redundant columns.

The address decoder 114 may include a row decoder and a column decoder to respectively address word lines and bit lines of the memory cells MC in the normal cell array 112. The address decoder 114 may select a memory cell MC corresponding to an address signal ADD applied from an outside of the memory device 100. The address decoder 114 may include a redundant decoder to address redundant rows or redundant columns in the redundant cell array 116.

The repair circuit unit 120 may include a first register 121, a second register 122, a comparer 123, a first storage unit 124, and a repair controller 125. The first register 121 may store a command signal CMD applied from an outside of the memory device 100. The first register 121 may receive a test mode register setting (MRS) command and may control an operation of the memory device 100. For example, the memory device 100 may be tested by using a test MRS command. In addition, the first register 121 may store the signal DQ applied from outside the memory device 100. The signal DQ may be written to a memory cell corresponding to the address signal ADD applied from outside the memory device 100.

The second register 122 may store the address signal ADD applied from an outside of the memory device 100. In addition, the second register 122 may store data read from a memory cell corresponding to the address signal ADD in the memory cell array 111.

The comparer 123 may compare the signal DQ stored in the first register 121 with the read data stored in the second register 122. Since the signal DQ of the first register 121 is data written to the memory cell corresponding to the address signal ADD and the read data of the second register 122 is data read from the memory cell corresponding to the address signal ADD, the signal DQ of the first register 121 may be expectation data of the read data.

The comparer 123 may compare the expectation data with the read data to generate a flag signal F_FLAG. When the expectation data is the same as the read data, the flag signal F_FLAG is inactivated or not generated, for example, a logic low level. When the expectation data is different from the read data, the flag signal F_FLAG is activated or generated, for example, a logic high level. The inactivation of the flag signal F_FLAG means that the memory cell corresponding to the address signal ADD is defect. The flag signal F_FLAG may be provided to the first storage unit 124.

The first storage unit 124 may store the address signal ADD stored in the second register 122 in response to the activated flag signal F_FLAG. That is, the first storage unit 124 may store a defect cell address FADD received from the comparer 123 and/or the second register 122. The first storage unit 124 may include a static random access memory (SRAM), a register, a latch, or the like. The defect cell address FADD may be provided to the fuse circuit unit 130.

The repair controller 125 may receive the command signal CMD applied from an outside of the memory device 100 and may store the defect cell address FADD of the first storage unit 124 in a second storage unit 131 included in the fuse circuit unit 130. The repair controller 125 may generate an internal command signal iCMD to control the fuse circuit unit 130 in response to, for example, the test MRS command. The repair controller 125 may include a counter 126 therein. The counter 126 may sequentially generate a count value CADD based on, for example, the test MRS command. The count value CADD may be provided to the fuse circuit unit 130.

The fuse circuit unit 130 may include a second storage unit 131 including an anti-fuse array, a predecoder 132 to receive the internal command signal iCMD and the count value CADD, a word line decoder 133 to enable one or more word lines in the second storage unit 131, and a column selecting unit 134 to select one or more bit lines in the second storage unit 131.

Figure 2:
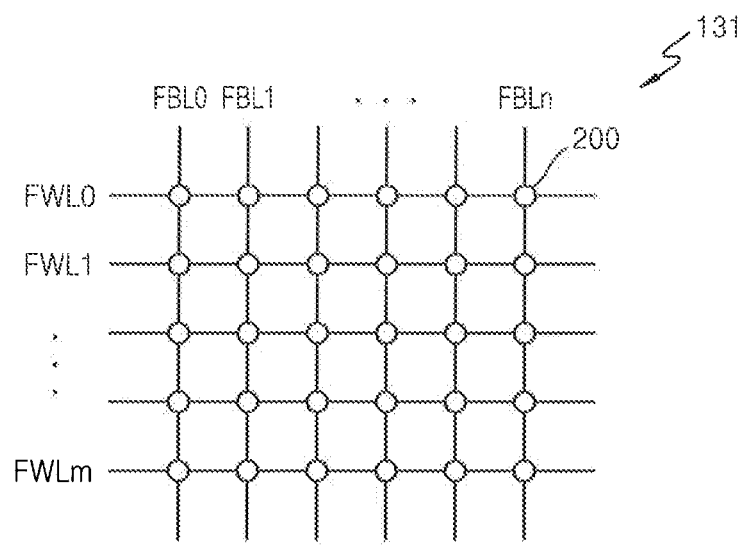
FIG. 2 is a diagram illustrating a first storage unit of the memory device of FIG. 1, according to an embodiment of the inventive concept.

As illustrated in FIG. 2, the second storage unit 131 may include a plurality of anti-fuses 200 that are arranged at corresponding interactions between word lines FWL0 to FWLm and bit lines FBL0 to FBLn. The word lines FWL0 to FWLm may be connected to the word line decoder 133, and the bit lines FBL0 to FBLn may be connected to the column selecting unit 134. The anti-fuses 200 may be electrically programmed.

Figure 3:
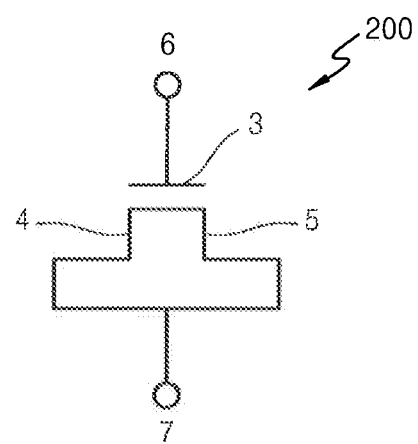
FIG. 3 is a diagram illustrating an anti-fuse included in the first storage unit of FIG. 2, according to an embodiment of the inventive concept.

As illustrated in FIG. 3, the anti-fuses 200 may each include a depletion-type metal oxide semiconductor (MOS) transistor in which a source 4 and a drain 5 are connected to each other. In an initial state, since a first node 6 connected to a gate electrode 3 and a second node 7 that is commonly connected to the source 4 and the drain 5 are separated from each other by a gate oxide layer, a resistance therebetween is very high. Thus, the first node 6 and the second node 7 are not connected to each other.

The anti-fuses 200 may irreversibly change a state from a disconnection state to a connection state by applying a breakdown voltage between the first node 6 and the second node 7 to breakdown the gate oxide layer. When the gate oxide layer breaks down, the resistance between the first node 6 and the second node 7 may be reduced.

The anti-fuses 200 may set a state where the resistance between the first node 6 and the second node 7 is high as a state programmed as, for example, a logic "0." In addition, the anti-fuses 200 may set a state where the resistance between the first node 6 and the second node 7 is low as a state programmed as, for example, a logic "1." A floating gate fuse (that uses a non-volatile memory cell) using hot carrier injection, a PermSRAM (HC injection) fuse, or the like as other non-volatile devices may be used instead of the anti-fuses 200.

Referring to back to FIG. 1, the predecoder 132 may decode the count value CADD in response to the internal command signal iCMD and may transmit the decoded count value CADD to the word line decoder 133 and the column selecting unit 134. The word line decoder 133 may enable the word lines FWL0 to FWLm in the second storage unit 131 in response to the decoded count value CADD. The column selecting unit 134 may select the bit lines FBL0 to FBLn of the second storage unit 131 in response to the decoded count value CADD.

The defect cell address FADD of the first storage unit 124 may be transmitted to the bit lines FBL0 to FBLn of the second storage unit 131. Anti-fuses 200 in the second storage unit 131 may be programmed according to the defect cell address FADD. The programmed defect cell address FADD of the second storage unit 131 may be provided to the address decoder 114 of the memory cell core unit 110. The address decoder 114 may address redundant rows or redundant columns in the redundant cell array 116 of the memory cell array 111, instead of the defect cell address FADD.

The memory device 100 may temporally store the defect cell address FADD, which is generated after packaging is performed, in the first storage unit 124, and then may permanently store the defect cell address FADD in the second storage unit 131. The defect cell address FADD stored in the second storage unit 131 may be replaced with a redundant row or redundant column in the memory cell array 111. Since a defect cell generated after packaging is performed is replaced with a redundant cell, a manufacturing yield after packaging is performed may be increased. In addition, since a memory to store the defect cell address FADD in a package test device of the memory device 100 is not required, manufacturing costs may be reduced by using an inexpensive package test device.

Figure 4:
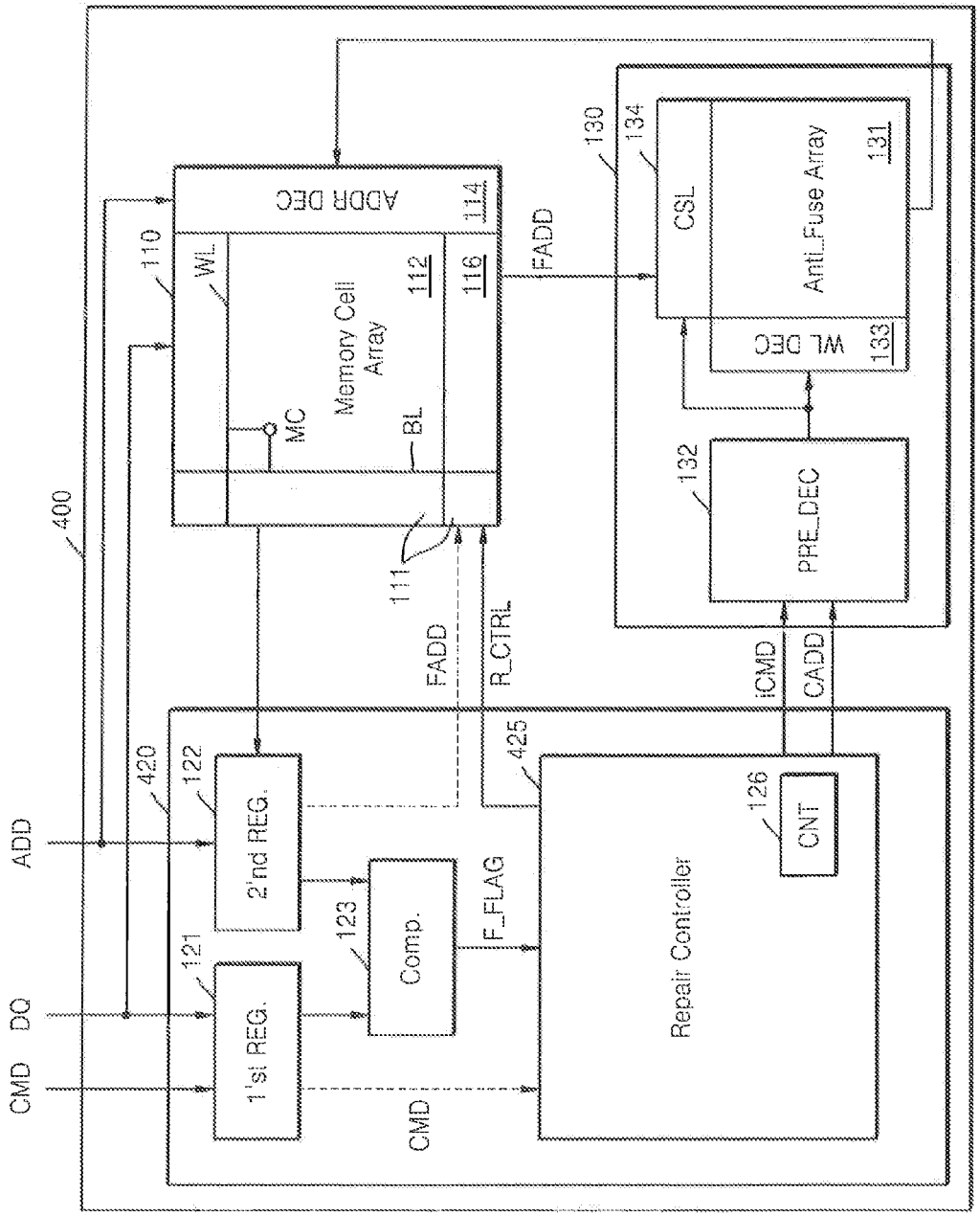
FIG. 4 is a block diagram illustrating a memory device according to an embodiment of the inventive concept.

FIG. 4 is a block diagram illustrating a memory device 400 according to an embodiment of the inventive concept.

Referring to FIG. 4, the memory device 400 may be different from the memory device 100 of FIG. 1 in that the memory device 400 does not include the first storage unit 124 (see FIG. 1) in a repair circuit unit 420. The first storage unit 124 to temporally store the defect cell address FADD may be replaced with the redundant cell array 116 of the memory cell array 111. The same elements in the memory device 400 are denoted by the same reference numerals of the memory device 100 of FIG. 1, and thus detail descriptions thereof will be omitted.

The memory device 400 may include the memory cell core unit 110, the repair circuit unit 420, and the fuse circuit unit 130. The memory cell core unit 110 may include the memory cell array 111 in which a plurality of memory cells are arranged in rows and columns, and the address decoder 114 to address memory cells. The memory cells in the memory cell array 111 may be divided and may be arranged in the normal cell array 112 and the redundant cell array 116. The address decoder 114 may include a row decoder and a column decoder, which address word lines and bit lines of the memory cells in the normal cell array 112. The address decoder 114 may include a redundant decoder to address redundant rows or redundant columns in the redundant cell array 116.

The repair circuit unit 420 may include the first register 121, the second register 122, the comparer 123, and a repair controller 425. The first register 121 may store the command signal CMD applied from an outside of the memory device 400 and may also store the signal DQ. The second register 122 may store the address signal ADD applied from an outside of the memory device 400 and data read from a memory cell corresponding to the address signal ADD in the memory cell array 111. The comparer 123 may compare the signal DQ stored in the first register 121 with the read data stored in the second register 122 and may generate the flag signal F_FLAG. When the signal DQ stored in the first register 121 is different from the read data stored in the second register 122, the flag signal F_FLAG may be activated to indicate that a memory cell corresponding to the address signal ADD stored in the second register 122 is defect. The flag signal F_FLAG may be provided to the repair controller 425.

The repair controller 425 may receive the command signal CMD applied from an outside of the memory device 400 and may store the defect cell address FADD of the second register 122 in the redundant cell array 116 in response to the flag signal F_FLAG. The repair controller 425 generates a redundancy control signal R_CTRL in response to the activation of the flag signal F_FLAG. The redundancy control signal R_CTRL may be provided to the redundant cell array 116 included in the memory cell array 111. The redundant cell array 116 may store the defect cell address FADD of the second register 122 in response to the redundancy control signal R_CTRL.

The repair controller 425 may generate the internal command signal iCMD to control the fuse circuit unit 130 in response to the command signal CMD applied from an outside of the memory device 400, for example, the test MRS command. The repair controller 425 may include the counter 126 therein. The counter 126 may sequentially the count value CADD based on, for example, the test MRS command. The count value CADD may be provided to the fuse circuit unit 130.

The fuse circuit unit 130 may include the second storage unit 131 including an anti-fuse array, the predecoder 132 to receive the internal command signal iCMD and the count value CADD, the word line decoder 133 to enable one or more word lines in the second storage unit 131, and the column selecting unit 134 to select one or more bit lines in the second storage unit 131. The predecoder 132 may decode the count value CADD in response to the internal command signal iCMD and may transmit the decoded count value CADD to the word line decoder 133 and the column selecting unit 134. The word line decoder 133 may enable the word lines FWL0 to FWLm in the second storage unit 131 in response to the decoded count value CADD. The column selecting unit 134 may select the bit lines FBL0 to FBLn of the second storage unit 131 in response to the decoded count value CADD.

The defect cell address FADD stored in the redundant cell array 116 may be transmitted to the bit lines FBL0 to FBLn of the second storage unit 131. Anti-fuses 200 in the second storage unit 131 may be programmed according to the defect cell address FADD. The programmed defect cell address FADD of the second storage unit 131 may be provided to the address decoder 114 of the memory cell core unit 110. The address decoder 114 may address redundant rows or redundant columns in the redundant cell array 116, instead of the defect cell address FADD.

The memory device 400 may temporally store the defect cell address FADD, which is generated after packaging is performed, in the redundant cell array 116, and then may permanently store the defect cell address FADD in the second storage unit 131. The defect cell address FADD stored in the second storage unit 131 may be replaced with a redundant row or redundant column in the memory cell array 111. Since a defect cell generated after packaging is performed is corrected by being replaced with a redundant cell, a manufacturing yield after packaging is performed may be increased. In addition, since a memory to store the defect cell address FADD in a package test device of the memory device 400 is not required, manufacturing costs may be reduced by using an inexpensive package test device.

Figure 5:
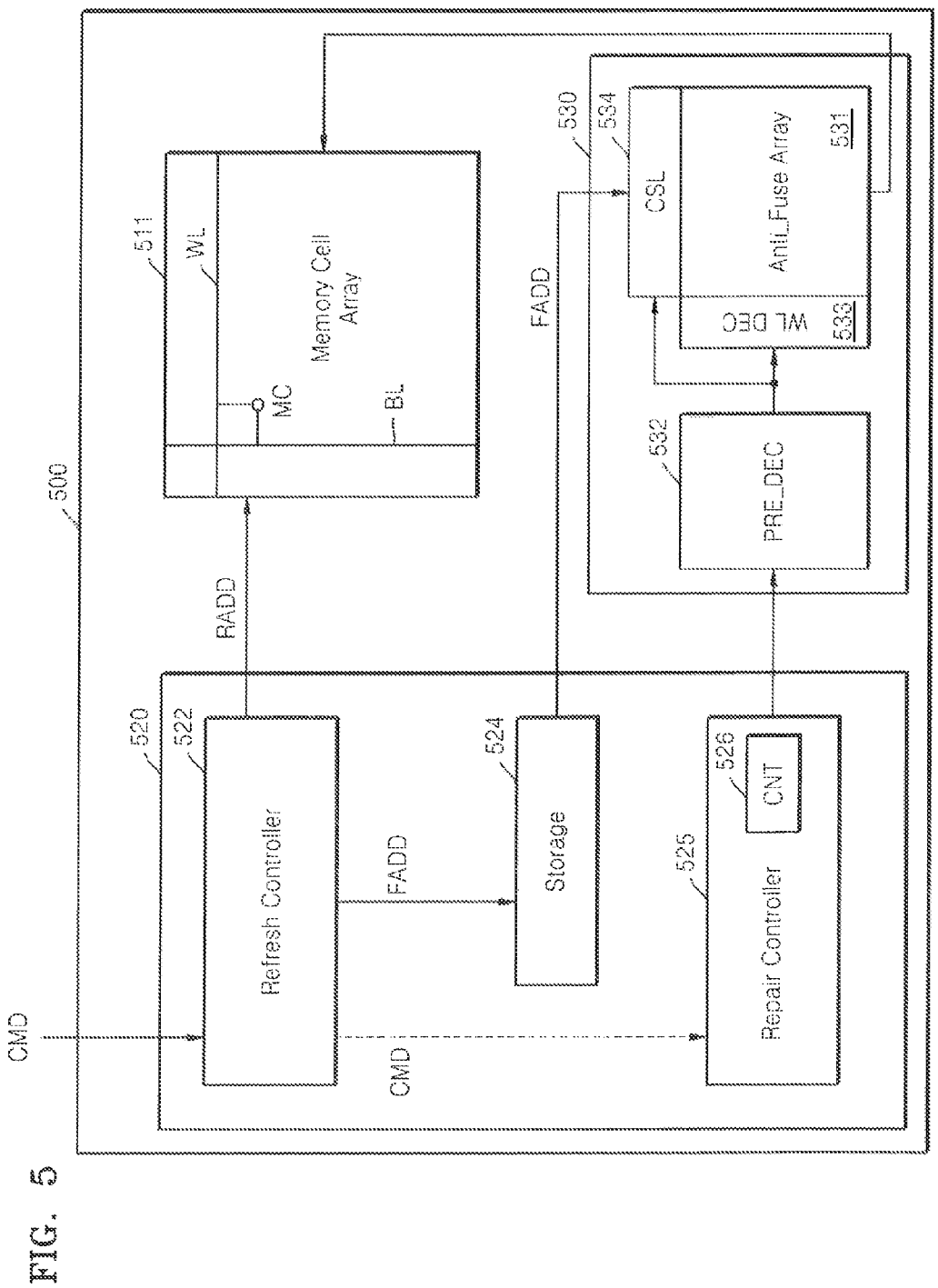
FIG. 5 is a block diagram illustrating a memory device according to an embodiment of the inventive concept.

FIG. 5 is a block diagram illustrating a memory device 500 according to an embodiment of the inventive concept.

Referring to FIG. 5, the memory device 500 includes a memory cell array 511, a refresh circuit unit 520, and a fuse circuit unit 530. In the memory cell array 511, the plurality of word lines WL and the bit lines BL cross each other and the memory cells MC are respectively arranged at corresponding intersections between the word lines WL and the bit lines BL. The memory cells MC may each be a one transistor, one capacitor (1T1C) DRAM cell. The memory cell array 511 may perform a refresh operation via the refresh circuit unit 520. The memory cell array 511 may enable a word line WL in response to a refresh address RADD provided from the refresh circuit unit 520 and may refresh data of memory cells connected to the word lines WL.

The refresh circuit unit 520 may include a refresh controller 522, a first storage unit 524, and a repair controller 525. The refresh controller 522 may perform a periodic refresh operation in order to retain data stored in a DRAM cell. The refresh operation may include an auto refresh operation and a self refresh operation.

The auto refresh operation is performed according to a refresh command input from an outside of the memory device 500. The self refresh operation may be performed according to a refresh signal that is automatically generated by the memory device 500. The self refresh operation may be performed for a stand-by time in order to satisfy low-power consumption. A partial array self refresh operation may be performed on a predetermined region instead of an entire memory cell array. When the partial array self refresh operation is performed, since a refresh operation is not performed on a region where data is not required to be retained, power consumption may be reduced for the stand-by time.

In the self refresh operation, the refresh operation with respect to the memory cell array 511 may be determined according to a predetermined pattern. For example, in the memory cell array 511 including banks 0 to 7, the refresh operation with respect to the respective banks may include 255 ($2^8$–1) patterns. Due to a pattern that does not perform the partial array self refresh operation all banks, the refresh operation may include ($2^8$–1) patterns.

When it is required to divide each bank into a plurality of segments and to specify refresh operations for the respective segments. If a memory is configured to include 8 banks×8 segments, the number of patterns is 65025 ($255^2$) due to 255 ($2^8$–1) patterns for the banks and 255 ($2^8$–1) patterns for the segments.

The refresh controller 522 may control a refresh operation of the memory cell array 511 by using these various patterns. The refresh controller 522 may store the command signal CMD applied from outside the memory device 500. The refresh controller 522 may receive an MRS command and may control the refresh operation. For example, the refresh controller 522 may refresh the memory cell array 511 based on the test MRS command.

In the refresh operation, memory cells having one or more poor refresh characteristics may be generated from among the memory cells MC in the memory cell array 511. The memory cells having poor refresh characteristics may be cells that do not satisfy a refresh standard. The refresh standard may be tRFC or tREFI parameters. The tRFC parameter refers to a refresh row cycle time. The tREFI parameter refers to a refresh interval time.

The refresh controller 522 may determine a refresh address RADD connected to a memory cell having the poor refresh characteristics as the defect cell address FADD and may provide the defect cell address FADD to the first storage unit 524.

The first storage unit 524 may store the defect cell address FADD having the poor refresh characteristics. The first storage unit 524 may include an SRAM, a register, a latch, or the like. The defect cell address FADD may be provided to a fuse circuit unit 530.

The repair controller 525 may receive the command signal CMD applied from an outside of the memory device 500 and may store the defect cell address FADD of the first storage unit 524 in a second storage unit 531 included in the fuse circuit unit 530. The repair controller 525 may generate the internal command signal iCMD for controlling the fuse circuit unit 530 in response to, for example, the test MRS command. The repair controller 525 may include a counter 526 therein. The counter 526 may sequentially generate a count value CADD based on, for example, the test MRS command. The count value CADD may be provided to the fuse circuit unit 530.

The fuse circuit unit 530 may include a second storage unit 531 including an anti-fuse array, a predecoder 532 to receive the internal command signal iCMD and the count value CADD, a word line decoder 533 to enable one or more word lines in the second storage unit 531, and a column selecting unit 534 to select one or more bit lines in the second storage unit 531.

As illustrated in FIG. 2, the second storage unit 531 may include a plurality of anti-fuses 200 that are arranged at corresponding intersections between the word lines FWL0 to FWLm and the bit lines FBL0 to FBLn. The word lines FWL0 to FWLm may be connected to the word line decoder 533, and the bit lines FBL0 to FBLn may be connected to the column selecting unit 534. The second storage unit 531 may use, instead of the anti-fuses 200 of FIG. 3, a floating gate fuse (that uses a non-volatile memory cell) using hot carrier injection, a PermSRAM (HC injection) fuse, or the like as other non-volatile devices.

The predecoder 532 may decode the count value CADD in response to the internal command signal iCMD and may transmit the decoded count value CADD to the word line decoder 533 and the column selecting unit 534. The word line decoder 533 may enable the word lines FWL0 to FWLm in the second storage unit 531 in response to the decoded count value CADD. The column selecting unit 534 may select the bit lines FBL0 to FBLn of the second storage unit 531 in response to the decoded count value CADD.

The defect cell address FADD of the first storage unit 524 may be transmitted to the bit lines FBL0 to FBLn of the second storage unit 531. Anti-fuses in the second storage unit 531 may be programmed according to the defect cell address FADD. The defect cell address FADD of the second storage unit 531 may be provided to the memory cell array 511.

The refresh controller 522 may perform a refresh operation to improve refresh characteristics of the memory cells MC connected to the defect cell address FADD stored in the second storage unit 131. For example, a tRFC time or a tREFI time may be set to be shorter than standard and the refresh operation may be performed.

The memory device 500 may temporally store the defect cell address FADD having poor refresh characteristics in the first storage unit 524 and then may permanently store the defect cell address FADD in the second storage unit 531. The defect cell address FADD stored in the second storage unit 531 may be corrected to be non-defect by correcting a refresh parameter during the refresh operation. Thus, a manufacturing yield may be increased.

Figure 6:
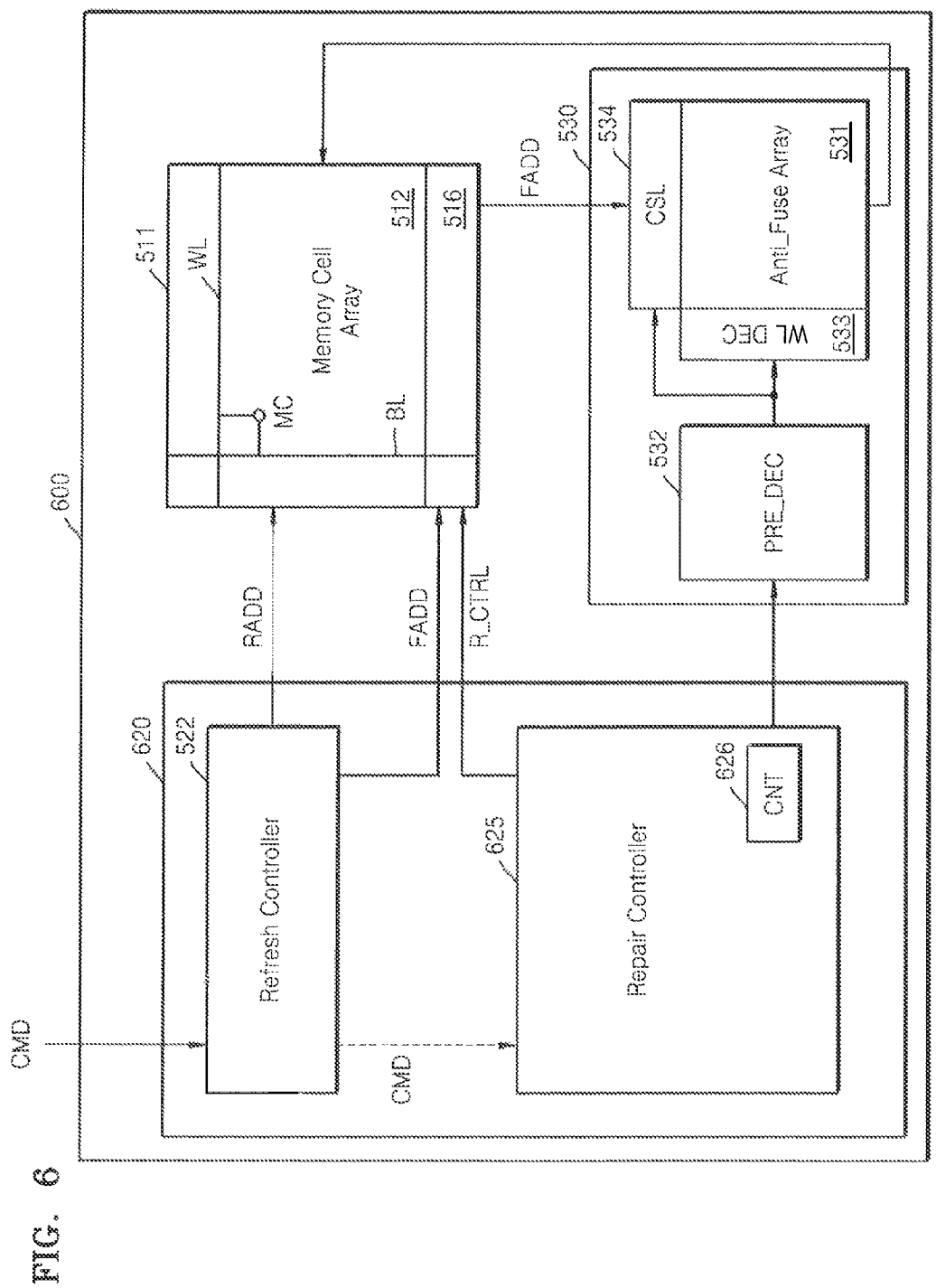
FIG. 6 is a block diagram illustrating a memory device according to an embodiment of the inventive concept.

FIG. 6 is a block diagram illustrating a memory device 600 according to an embodiment of the inventive concept.

Referring to FIG. 6, the memory device 600 may be different from the memory device 500 of FIG. 5 in that the memory device 600 does not include the first storage unit 524 (see FIG. 5) in a repair circuit unit 620. The first storage unit 124 to temporally store the defect cell address FADD may be replaced with a redundant cell array 516 of the memory cell array 511. The same elements in the memory device 600 are denoted by the same reference numerals of the memory device 500 of FIG. 5, and thus detail descriptions thereof will be omitted.

The memory device 600 includes the memory cell array 511, the repair circuit unit 620, and the fuse circuit unit 530. The memory cell array 511 may include a normal cell array 512 and the redundant cell array 516, in which a plurality of memory cells are arranged in rows and columns.

The repair circuit unit 620 may include the refresh controller 522 and a repair controller 625. The refresh controller 522 may control a periodic refresh operation in order to retain data stored in a DRAM cell. The refresh controller 522 may control a refresh operation of the memory cell array 511 by using one or more patterns. The refresh controller 522 may refresh the memory cell array 511 by using the test MRS command applied from an outside of the memory device 600. The refresh controller 522 may determine the refresh address RADD connected to a memory cell having one or more poor refresh characteristics as the defect cell address FADD and provide the defect cell address FADD to the redundant cell array 516.

The repair controller 625 may receive the command signal CMD applied from an outside of the memory device 600, for example, the test MRS command and may generate a redundancy control signal R_CTRL. The redundancy control signal R_CTRL may be provided to the redundant cell array 516 in the memory cell array 511. The redundant cell array 516 may store the defect cell address FADD of the refresh controller 522 in response to the redundancy control signal R_CTRL.

The repair controller 625 may generate the internal command signal iCMD to control the fuse circuit unit 530 in response to the command signal CMD applied from outside the memory device 600, for example, the test MRS command. The repair controller 625 may include a counter 626 therein. The counter 626 may sequentially generate a count value CADD based on, for example, the test MRS command. The count value CADD may be provided to the fuse circuit unit 530.

The fuse circuit unit 530 may include the second storage unit 531 including an anti-fuse array, the predecoder 532 to receive the internal command signal iCMD and the count value CADD, the word line decoder 533 to enable one or more word lines in the second storage unit 531, and the column selecting unit 534 to select one or more bit lines in the second storage unit 531. The predecoder 532 may decode the count value CADD in response to the internal command signal iCMD and may transmit the decoded count value CADD to the word line decoder 533 and the column selecting unit 534. The word line decoder 533 may enable a word line in the second storage unit 531 in response to the decoded count value CADD. The column selecting unit 534 may select bit lines of the second storage unit 531 in response to the decoded count value CADD.

The defect cell address FADD stored in the redundant cell array 516 may be transmitted to the bit lines FBL0 to FBLn of the second storage unit 531. Anti-fuses in the second storage unit 531 may be programmed according to the defect cell address FADD.

The programmed defect cell address FADD of the first storage unit 524 may be transmitted to the bit lines FBL0 to FBLn of the second storage unit 531. Anti-fuses in the second storage unit 531 may be programmed according to the defect cell address FADD. The programmed defect cell address FADD of the second storage unit 131 may be provided to the memory cell array 511.

The refresh controller 522 may perform a refresh operation to improve one or more refresh characteristics of the memory cells MC connected to the defect cell address FADD stored in the second storage unit 131. For example, a tRFC time or a tREFI time may be set to be shorter than a standard, and the refresh operation may be performed.

The memory device 600 may temporally store the defect cell address FADD having poor refresh characteristics in the redundant cell array 516 and then may permanently store the defect cell address FADD in the second storage unit 531. The defect cell address FADD stored in the second storage unit 531 may be corrected to be non-defect by correcting a refresh parameter during the refresh operation. Thus, a manufacturing yield may be increased.

A repair circuit unit, a fuse circuit unit, and a refresh circuit unit according to the above-described embodiment of the inventive concept may be included in a semiconductor device, for example, a double data rate-synchronous dynamic random access memory (DDR-SDRAM).

Figure 7:
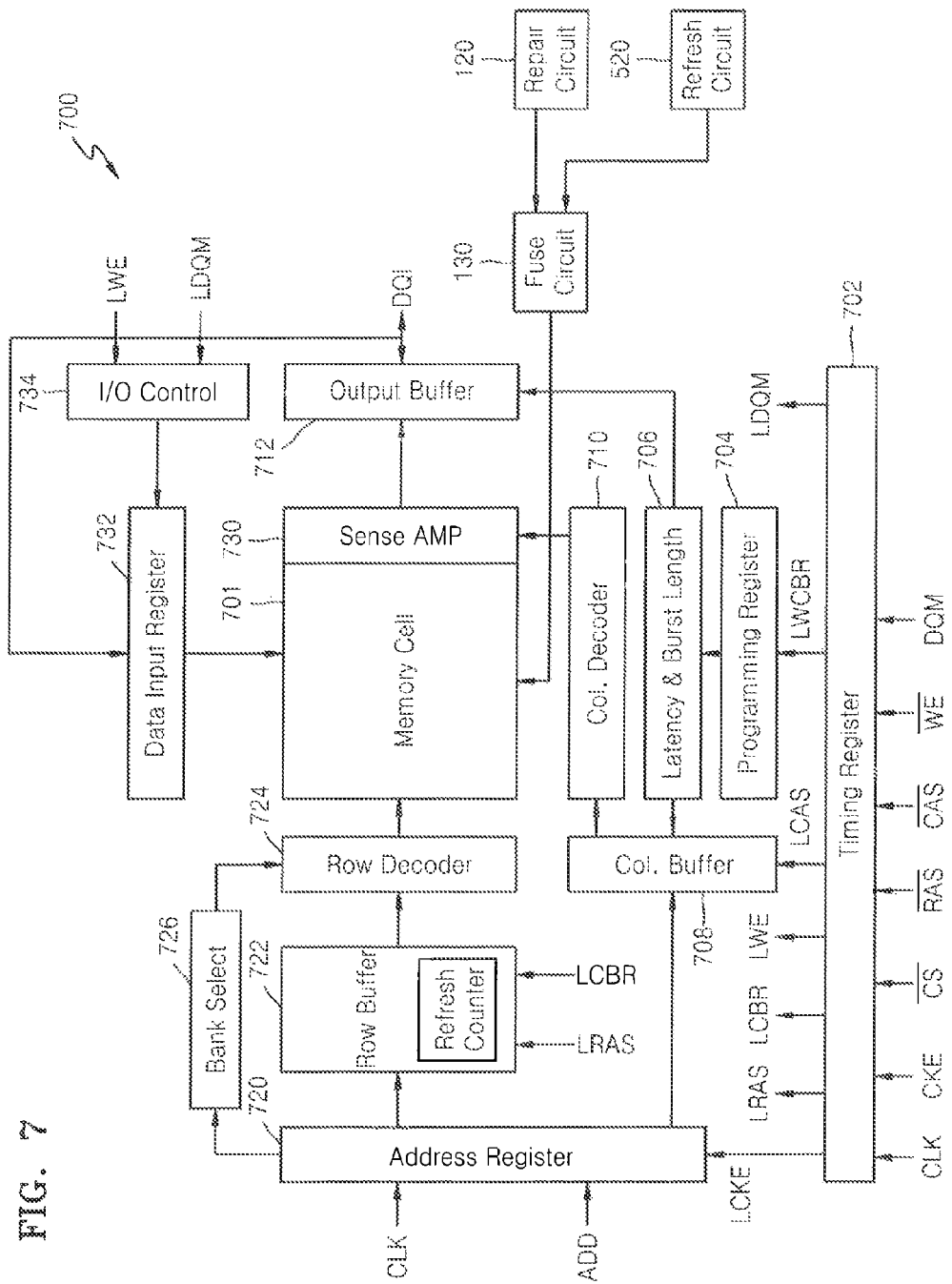
FIG. 7 is a block diagram illustrating a semiconductor memory device embodied as at least one memory device according to an embodiment of the inventive concept.

Referring to FIG. 7, a DDR-SDRAM 700 may include a memory cell array 701 including DRAM cells and various circuit blocks to drive the DRAM cells. For example, a timing register 702 may be activated when a chip selecting signal CS is converted from an inactivation level (e.g., logic high) into an activation level (e.g., logic low). The timing register 702 may receive a command signal CMD, such as a clock signal CLK, a clock enable signal CKE, a chip selecting signal CSB (or CS), a row signal Row an address strobe signal RASB to correspond to a raw address access (RAS) clock, a column signal Column and an address strobe signal CASB to correspond to column address access (CAS) clock, a writing enable signal WEB (or WE), a data input/output signal DQM, or the like, from an outside of the DDR-SDRAM 700 and may process the received command signal CMD to generate various internal command signals LCKE, DQi, LRAS, LCBR, LWE, LCAS, LWCBR, and LDQM.

A portion of the above internal command signals, for example, LCKE, DQi, LRAS, LCBR, LWE, LCAS, LWCBR, and LDQM, generated from the timing register 702 may be stored in a programming register 704. For example, latency information related to a data output, burst length information, and so on may be stored in the programming register 704. The internal command signals stored in the programming register 704 may be provided to a latency/burst length controller 706. The latency/burst length controller 706 may provide a control signal to control latency of a data output and a burst length to a column decoder 710 through a column address buffer 708 or an output buffer 712.

An address register 720 may receive an address signal ADD from an outside of the DDR-SDRAM 700. A row address signal may be provided to a row decoder 724 via a row address buffer 722. In addition, a column address signal may be provided to the column decoder 710 via the column address buffer 708. The row address buffer 722 may further receive a refresh address signal generated from a refresh counter in response to refresh commands LRAS and LCBR and may provide any one of the row address signal and the refresh address signal to the row decoder 724. In addition, the address register 720 may provide a bank signal to select a bank to a bank selecting unit 726.

The row decoder 724 may decode a row address signal or a refresh address signal, which are input from the row address buffer 722, and may activate a word line of the memory cell array 701. The column decoder 710 may decode a column address signal and may perform a selection operation on a bit line of the memory cell array 701. For example, a column selection line may be applied to the DDR-SDRAM 700 and a selection operation may be performed on the column selection line.

A sense amplifier 730 may amplify data of a memory cell that is selected by the row decoder 724 and the column decoder 710 and may provide the amplified data to the output buffer 712. Data to be written to a data cell may be provided to the memory cell array 701 via a data input register 732. An input/output controller 734 may control a data transmission operation via the data input register 732.

A repair circuit unit, for example, the repair circuit unit 120 of FIG. 1 or the repair circuit unit 420 of FIG. 4, may store a command, an address, and expectation data, which are applied from an outside of the DDR-SDRAM 700, may compare the expectation data with data read from a memory cell corresponding to the address, may temporally store a defect cell address in a first storage unit including a volatile memory device, may generate an internal command signal in response to the command, and may sequentially generate a count value from a counter. The repair circuit unit 120 (or 420) may store a defect cell address in a redundant cell array included in the memory cell array 701, instead of in the first storage unit.

A refresh circuit, for example, the refresh circuit unit 520 of FIG. 5 or the refresh circuit 620 of FIG. 6, may generate a refresh address in response to a command applied from outside the DDR-SDRAM 700, may control a refresh operation of a memory cell array according to the refresh address, may temporally store a cell address having poor refresh characteristics in a first storage unit including a volatile memory device, may generate an internal command signal in response to the command, and may sequentially generate a count value from a counter. The refresh circuit unit 520 (or 620) may store a cell address having poor refresh characteristics in a redundant cell array included in the memory cell array 701, instead of in the first storage unit.

A fuse circuit unit, for example, the fuse circuit unit 130 of FIG. 1 or the fuse circuit unit 530 of FIG. 5, may decode the count value in response to the internal command, may select word lines and bit lines in a fuse array in response to the decoded count value, and may permanently store a defect cell address of the first storage unit, which is transmitted to the bit lines, or the cell address having poor refresh characteristics, in a second storage unit. The defect cell address stored in the second storage unit may be corrected by using a redundant row or a redundant column in the memory cell array 701. The cell address having poor refresh characteristics, which is stored in the second storage unit, may be corrected to be non-defect by correcting a refresh parameter during the refresh operation.

Figure 8:
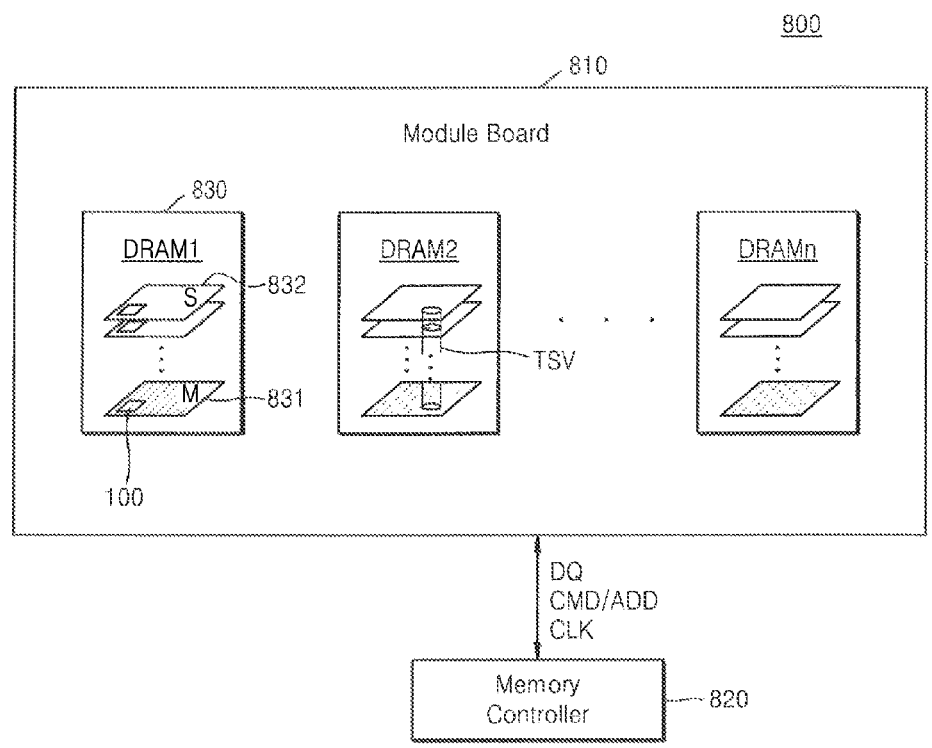
FIG. 8 is a block diagram illustrating a memory system including a semiconductor memory device of FIG. 7, according to an embodiment of the inventive concept.

FIG. 8 is a block diagram illustrating a memory system 800 including a semiconductor memory device, for example, the DDR-SDRAM 700 of FIG. 7, according to an embodiment of the inventive concept.

Referring to FIG. 8, the memory system 800 may include a memory module 810 and a memory controller 820. The memory module 810 may be configured in such a way that at least one semiconductor memory device 830 may be mounted on a module board. The semiconductor memory device 830 may be embodied as a DRAM chip and may include a plurality of semiconductor layers. The semiconductor layers may each include one or more master chips 831 and one or more slave chips 832. Signals may be transmitted between the semiconductor layers via a through silicon via TSV.

The master chips 831 and the slave chips 832 may each include a repair circuit unit, a refresh circuit unit, and a fuse circuit unit according to an embodiment of the inventive concept. The repair circuit unit, the refresh circuit unit, and the fuse circuit unit are described above with reference to FIGS. 1-7. The repair circuit unit may store a command, an address, and expectation data, which are applied from an outside of the DDR-SDRAM 700, may compare the expectation data with data read from a memory cell corresponding to the address, may temporally store a defect cell address in a first storage unit including a volatile memory device, may generate an internal command signal in response to the command, and may sequentially generate a count value from a counter. The repair circuit unit may store the defect cell address in a redundant cell array included in a memory cell array, instead of in the first storage unit.

The refresh circuit unit may generate a refresh address in response to a command from outside the DDR-SDRAM 700, may control a refresh operation of a memory cell array according to the refresh address, may temporally store a cell address having poor refresh characteristics in the first storage unit including a non-volatile memory device, may generate an internal command signal in response to a command, and may sequentially generate a count value from a counter. The refresh circuit unit may store the cell address having poor refresh characteristics in a redundant cell array included in a memory cell array, instead of in the first storage unit.

The fuse circuit unit may decode a count value in response to the internal command, may select word lines and bit lines in the fuse array in response to the decoded count value, and may permanently store a defect cell address of the first storage unit, which is transmitted to the bit lines, or the cell address having poor refresh characteristics, in a second storage unit including non-volatile memory devices. The defect cell address stored in the second storage unit may be corrected by using a redundant row or a redundant column in the memory cell array. The cell address having poor refresh characteristics, which is stored in the second storage unit, may be corrected to be non-defect by correcting a refresh parameter during the refresh operation.

The memory module 810 may communicate with the memory controller 820 via a system bus. Data DQ, a command/address CMD/ADD, a clock signal CLK, and so on may be transmitted between the memory module 810 and the memory controller 820 via a system bus to perform a function of the memory system.

Figure 9:
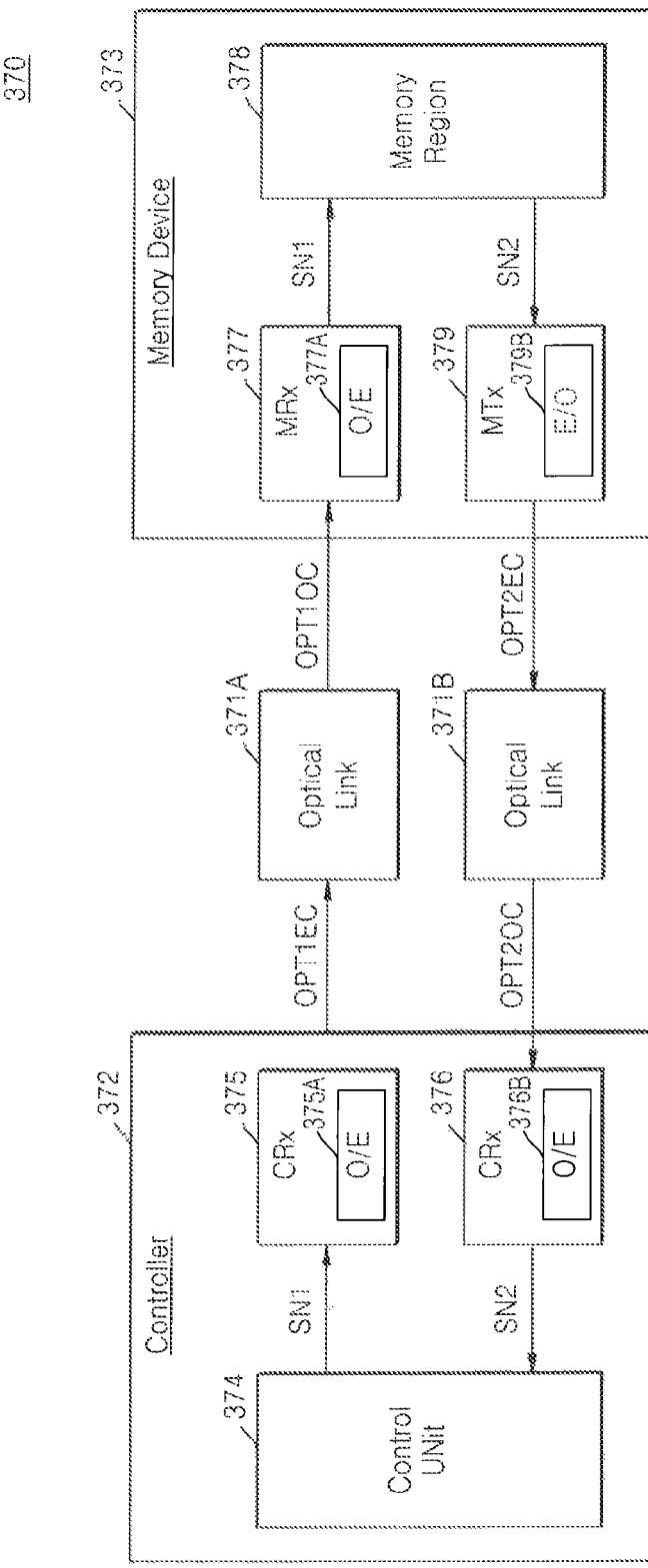
FIG. 9 is a block diagram illustrating a memory system including a memory device, according to an embodiment of the inventive concept

FIG. 9 is a block diagram illustrating a memory system 370 including a memory device 373 according to an embodiment of the inventive concept.

Referring to FIG. 9, the memory system 370 includes optical connecting devices 371A and 371B, a controller 372, and a memory device 373. The optical connecting devices 371A and 371B interconnect the controller 372 and the memory device 373. The controller 372 includes a control unit 374, a first transmitting unit 375, and a first receiving unit 376. The control unit 374 transmits a first electric signal SN1 to the first transmitting unit 375. The first electric signal SN1 may include command signals, clocking signals, address signals, writing data, and the like, which are transmitted to the memory device 373.

The first transmitting unit 375 includes a first optical modulator 375A. The first optical modulator 375A converts the first electric signal SN1 into a first optical transmitting signal OTP1EC and transmits the first optical transmitting signal OTP1EC to the optical connecting device 371A. The first optical transmitting signal OTP1EC may be transmitted via the optical connecting device 371A via serial communication. The first receiving unit 376 includes a first optical modulator 376B. The first optical modulator 376B converts a second optical receiving signal OPT2OC received from the optical connecting device 371B into a second electric signal SN2 and transmits the second electric signal SN2 to the control unit 374.

The memory device 373 includes a second receiving unit 377, a memory region 378, and a second transmitting unit 379. The second receiving unit 377 includes a second optical modulator 377A. The second optical modulator 377A converts a first optical receiving signal OPT1OC received from the optical connecting device 371A into the first electric signal SN1 and transmits the first electric signal SN1 to the memory region 378.

The memory region 378 may temporally store a defect cell address, which is generated after packaging is performed, in a first storage unit and then may permanently store the defect cell address in a second storage unit. The defect cell address stored in the second storage unit may be replaced with a redundant row or redundant column in the memory cell array. Since a defect cell generated after packaging is performed is corrected, a manufacturing yield after packaging is performed may be increased. In addition, since the memory region 378 does not require an additional memory to store a defect cell address in a package test device, manufacturing costs may be reduced by using an inexpensive package test device.

In addition, the memory region 378 may temporally store a cell address having poor refresh characteristics in the first storage unit and then may permanently store the cell address having poor refresh characteristics in the second storage unit. The defect cell address stored in the second storage unit may be corrected to be non-defect by correcting a refresh parameter during the refresh operation. Thus, a manufacturing yield may be increased.

The memory region 378 may write writing data in a memory cell in response to the first electric signal SN1 or may transmit data read from the memory region 378 as the second electric signal SN2 to the second transmitting unit 379. The second electric signal SN2 may include a clocking signal, reading data, and so on, which are transmitted to the controller 372. The second transmitting unit 379 includes a second optical modulator 379B. The second optical modulator 379B converts the second electric signal SN2 into a second optical data signal OPT2EC and transmits the second optical data signal OPT2EC to the optical connecting device 371B. The second optical data signal OPT2EC may be transmitted via the optical connecting device 371B via serial communication.

Figure 10:
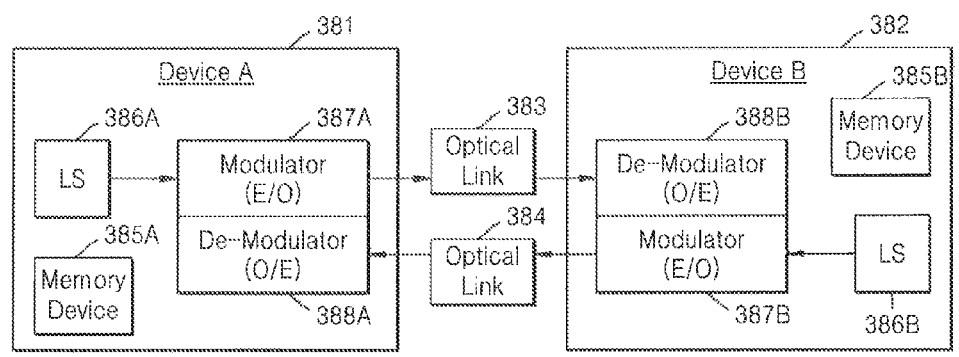
FIG. 10 is a block diagram illustrating a data processing system including one or more memory devices according to an embodiment of the inventive concept.

FIG. 10 is a block diagram illustrating a data processing system 380 including memory devices 385A and 385B according to an embodiment of the inventive concept.

Referring to FIG. 10, the data processing system 380 includes a first device 381, a second device 382, and a plurality of optical connecting devices 383 and 384. The first device 381 and the second device 382 may perform optical communication via serial communication.

The first device 381 may include the memory device 385A, a first light source 386A, a first optical modulator 387A for performing an electric to optical conversion operation, and a first optical de-modulator 388A for performing an optical to electric conversion operation. The second device 382 includes the memory device 385B, a second light source 386B, a second optical modulator 387B, and a second optical de-modulator 388B.

The memory devices 385A and 385B may be referred to the memory device illustrated in FIGS. 1-9 and temporally store a defect cell address, which is generated after packaging is performed, in a first storage unit and then may permanently store the defect cell address in a second storage unit. The defect cell address stored in the second storage unit may be replaced with a redundant row or redundant column in the memory cell array. Since a defect cell generated after packaging is performed is corrected, a manufacturing yield after packaging is performed may be increased. In addition, the memory devices 385A and 385B do not require a memory for storing a defect cell address in a package test device, manufacturing costs may be reduced by using an inexpensive package test device.

In addition, the memory devices 385A and 385B may temporally store a cell address having poor refresh characteristics in the first storage unit and then may permanently store the cell address having poor refresh characteristics in the second storage unit. The defect cell address stored in the second storage unit may be corrected to be non-defect by correcting a refresh parameter during the refresh operation. Thus, a manufacturing yield may be increased.

The first and second light sources 386A and 386B output an optical signal having a duration waveform. The first and second light sources 386A and 386B may use a distributed fee-back laser diode (DFB-LD) that is a multi-wavelength light source or a Fabry-Perot laser diode (FP-LD).

The first optical modulator 387A converts transmission data into an optical transmission signal and transmits the optical transmission signal to the optical connecting device 383. The first optical modulator 387A may modulate a wavelength of an optical signal received from the first light source 386A according to the transmission data. The first optical de-modulator 388A receives an optical signal output from the second optical modulator 387B of the second device 382 via the optical connecting device 384, demodulates the optical signal, and outputs an electric signal.

The second optical modulator 387B converts transmission data of the second device 382 into an optical transmission signal and transmits the optical transmission signal to the optical connecting device 384. The second optical modulator 387B may demodulate a wavelength of the optical signal received from the second light source 386B according to the transmission data. The second optical de-modulator 388B may receive an optical signal output from the first optical modulator 387A of the first device 381 through the optical connecting device 383, demodulate the optical signal, and outputs a demodulated electric signal.

Figure 11:
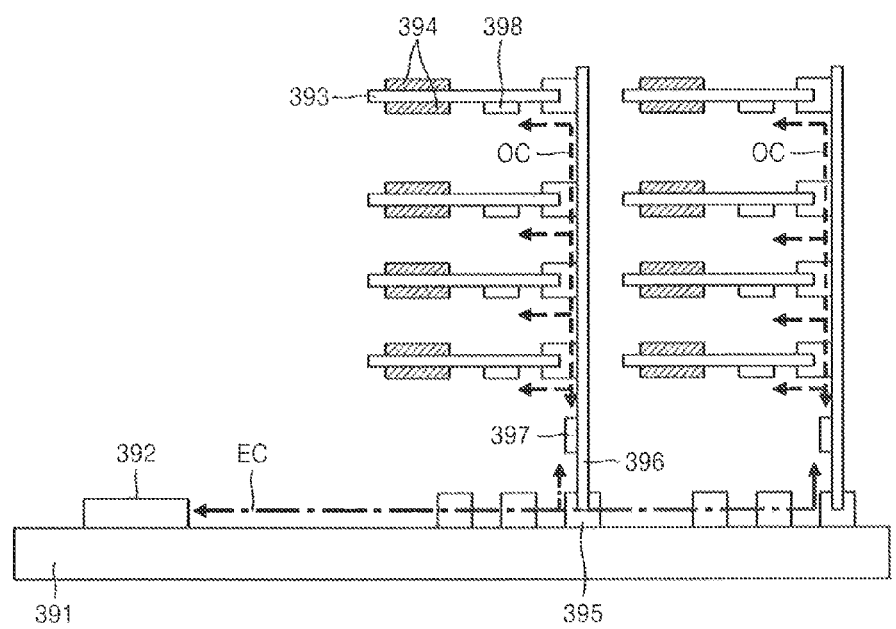
FIG. 11 is a diagram illustrating a server system including one or more memory devices according to an embodiment of the inventive concept.

FIG. 11 is a diagram illustrating a server system 390 including memory devices according to an embodiment of the inventive concept.

Referring to FIG. 11, the server system 390 includes a memory controller 392 and a plurality of memory modules 393. The memory modules 393 may each include a plurality of memory chips 394. The memory modules 393 and/or memory chips 394 may be referred to as the memory module and/or the memory device illustrated in FIGS. 1-10. The memory chips 394. The memory chips 394 may temporally store a defect cell address, which is generated after packaging is performed, in a first storage unit and then may permanently store the defect cell address in a second storage unit. The defect cell address stored in the second storage unit may be replaced with a redundant row or redundant column in the memory cell array. Since a defect cell generated after packaging is performed is corrected, a manufacturing yield after packaging is performed may be increased. In addition, the memory chips 394 do not require a memory to store a defect cell address in a package test device, and thus, manufacturing costs may be reduced by using an inexpensive package test device.

In addition, the memory chips 394 may temporally store a cell address having poor refresh characteristics in the first storage unit and then may permanently store the cell address having poor refresh characteristics in the second storage unit. The defect cell address stored in the second storage unit may be corrected to be non-defect by correcting a refresh parameter during the refresh operation. Thus, a manufacturing yield may be increased.

The server system 390 may have a structure in which a second circuit board 396 is coupled to sockets 395 of a first circuit board 391. The server system 390 may be configured as a channel structure in which a single second circuit board 396 is connected to the first circuit board 391 for each respective channel. However, the inventive concept is not limited thereto, and thus, the server system 390 may have various structures.

Signals may be transmitted between the memory modules 393 via an optical IO connection. For the optical 10 connection, the server system 390 may further include an electric to optical conversion unit 397 and the memory modules 393 may each further include an optical to electric conversion unit 398.

The memory controller 392 is connected to the electric to optical conversion unit 397 via an electrical channel EC. The electric to optical conversion unit 397 converts the electrical signal that is received from the memory controller 392 via the electrical channel EC into an optical signal and transmits the optical signal toward an optical channel OC. The electric to optical conversion unit 397 converts the optical signal that is received via the optical channel OC and processes a signal transmitted toward the electrical channel EC.

The memory modules 393 are connected to the electric to optical conversion unit 397 via the optical channel OC. An optical signal applied to the memory modules 393 may be converted into an electrical signal via the optical to electric conversion unit 398 and may be transmitted to the memory chips 394. The server system 390 including these optical connecting memory modules may support a high storage capacity and a high processing speed.

Figure 12:
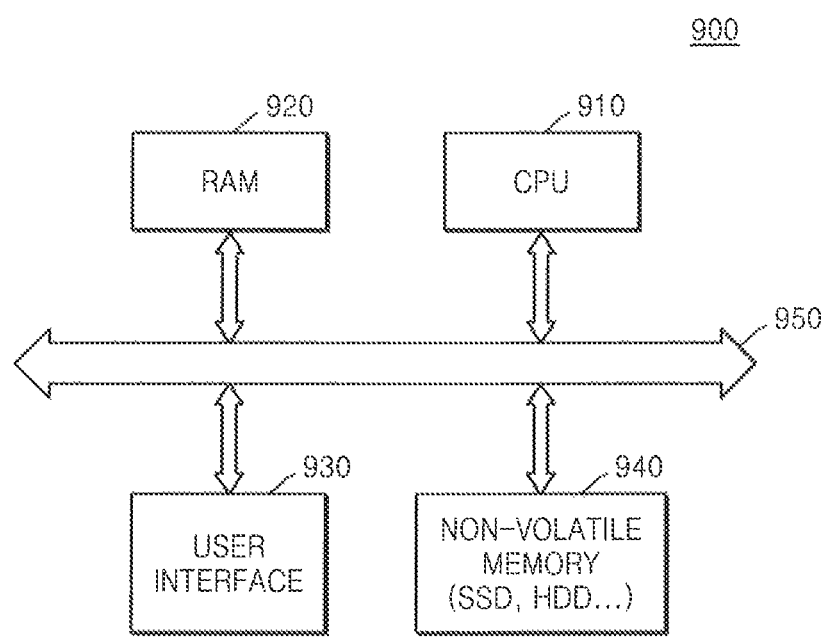
FIG. 12 is a block diagram illustrating a computing system on which a memory system is mounted, according to an embodiment of the inventive concept.

FIG. 12 is a block diagram illustrating a computing system 900 on which a memory system is mounted, according to an embodiment of the inventive concept.

Referring to FIG. 12, a semiconductor memory device, for example, a random access memory (RAM) 920, according to an embodiment of the inventive concept may be mounted on the computing system 900, such as a mobile device, a tablet computer apparatus, or a desktop computer apparatus. The semiconductor memory device mounted as the RAM 920 may be any one of the memory devices illustrated in FIGS. 1-11. For example, the RAM 920 may be a semiconductor memory device from among the memory devices or the memory modules according to the above-described embodiments of the inventive concept. In addition, the RAM 920 may include a memory controller such as a semiconductor memory device.

The computing system 900 includes a central processing unit 910, the RAM 920, a user interface 930, and a non-volatile memory 940, which are electrically connected to a bus 950. The non-volatile memory 940 may be a large-capacity storage device such as a solid state disk (SSD) or a hard disk drive (HDD).

The RAM 920 of the computing system 900 may include a repair circuit unit, a refresh circuit unit, and a fuse circuit unit which are illustrated with reference to FIGS. 1-11 according to the above-described embodiments of the inventive concept. The repair circuit unit may store a command, an address, and expectation data, which are applied from outside the RAM 920, may compare the expectation data with data read from a memory cell corresponding to the address, may temporally store a defect cell address in a first storage unit including a non-volatile memory device, may generate an internal command signal in response to the command, and may sequentially generate a count value from a counter. The repair circuit unit may store the defect cell address in a redundant cell array included in a memory cell array, instead of in the first storage unit.

The refresh circuit unit may generate a refresh address in response to a command from outside the RAM 920, may control a refresh operation of a memory cell array according to the refresh address, may temporally store a cell address having poor refresh characteristics in the first storage unit including a non-volatile memory device, may generate an internal command signal in response to a command, and may sequentially generate a count value from a counter. The refresh circuit unit may store the cell address having poor refresh characteristics in a redundant cell array included in a memory cell array, instead of in the first storage unit.

The fuse circuit unit may decode a count value in response to the internal command, may select word lines and bit lines in the fuse array in response to the decoded count value, and may permanently store a defect cell address of the first storage unit, which is transmitted to the bit lines, or the cell address having poor refresh characteristics, in a second storage unit including non-volatile memory devices. The defect cell address stored in the second storage unit may be corrected by using a redundant row or a redundant column in the memory cell array. The cell address having poor refresh characteristics, which is stored in the second storage unit, may be corrected to be non-defect by correcting a refresh parameter during the refresh operation.

The memory systems 800 and 370 of FIGS. 8 and 9, the data processing system 380 of FIG. 10, the server system 380 of FIG. 11, and the computing system of FIG. 12 may be referred to an electronic apparatus to control reading and writing data in semiconductor memory cells as a function of the electronic apparatus.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A memory device comprising:
    a memory cell array in which a plurality of memory cells are arranged;
    a repair circuit unit comprising:
        a first register to store a command and first data, which are applied from an outside of the memory device,
        a second register to store an address applied from the outside of the memory device and to store second data read from a memory cell corresponding to the address from the memory cell array,
        a comparer to compare the first data with the second data and to generate a flag signal indicating that the memory cell is a defect cell based on a result of the comparison, and a first storage unit to store defect cell information of the memory cell array and to store a defect cell address in response to the flag signal; and a fuse circuit unit comprising a second storage unit that is programmed according to the defect cell information stored in the first storage unit.

2. The memory device of claim 1, wherein the defect cell information corresponds to an address of the defect cell and the defect cell is generated after packaging of the memory device is performed.

3. The memory device of claim 2, wherein the repair circuit unit further comprises:

a repair controller to generate an internal command signal and to sequentially generate a count value from a counter in response to the command.

4. The memory device of claim 3, wherein the first storage unit comprises one of a register, a static random access memory (SRAM), and a latch.

5. The memory device of claim 3, wherein the fuse circuit unit comprises:

a predecoder to decode the count value in response to the internal command signal;

the second storage unit in which non-volatile devices are arranged at intersections between a plurality of word lines and a plurality of bit lines;

a word line decoder to select the word lines in response to the decoded count value; and a column selecting unit to select the bit lines in response to the decoded count value, wherein the defect cell address of the first storage unit is transmitted to the bit lines.

6. The memory device of claim 5, wherein the non-volatile devices comprise one of an anti-fuse, a floating gate fuse, and a hot carrier injection fuse, which are electrically programmable.

7. The memory device of claim 1, wherein the defect cell information corresponds to an address of a memory cell having one or more poor refresh characteristics from among the memory cells in the memory cell array.

8. The memory device of claim 7, wherein the repair circuit unit comprises:

a repair controller to generate an internal command signal and sequentially generate a count value from a counter in response to the command.

9. A memory device comprising:

a memory cell array in which a plurality of memory cells are arranged to be divided into a normal cell array and a redundant cell array;

a repair circuit unit to store defect cell information of the memory cell array in the redundant cell array; and a fuse circuit unit comprising a storage unit that is programmed according to the defect cell information that is stored in the redundant cell array, wherein the repair circuit unit comprises:

a first register to store a command and first data, which are applied from an outside of the memory device;

a second register to store an address applied from the outside of the memory device and second data read from a memory cell corresponding to the address from the memory cell array;

a comparer to compare the first data with the second data and to generate a flag signal indicating that the memory cell is a defect cell; and a repair controller to store the defect cell information in the redundant cell array in response to the flag signal, and to generate an internal command signal and sequentially generate a count value from a counter in response to the command.

10. The memory device of claim 9, wherein the fuse circuit unit comprises:

a predecoder to decode the count value in response to the internal command signal;

the storage unit in which non-volatile devices are arranged at intersections between a plurality of word lines and a plurality of bit lines;

a word line decoder to select the word lines in response to the decoded count value; and a column selecting unit to select the bit lines in response to the decoded count value, wherein a defect cell address of the redundant cell array is transmitted to the bit lines.

11. The memory device of claim 10, wherein the non-volatile devices comprise one of an anti-fuse, a floating gate fuse, and a PermSRAM (an HC injection) fuse, which are electrically programmable.

12. The memory device of claim 9, wherein the defect cell information corresponds to an address of a memory cell having poor refresh characteristics from among the memory cells in the memory cell array.

13. The memory device of claim 12, wherein the repair circuit unit comprises:

a controller to generate a refresh address in response to a command applied from outside the memory device, to control a refresh operation of the memory cell array according to the refresh address, and to determine a memory cell having one or more poor refresh characteristics as a defect memory cell during the refresh operation; and a repair controller to generate an internal command signal and to sequentially generate a count value from a counter in response to the command.

14. The memory device of claim 13, wherein the fuse circuit unit comprises:

a predecoder to decode the count value in response to the internal command signal;

the second storage unit in which non-volatile devices are arranged at intersections between a plurality of word lines and a plurality of bit lines;

a word line decoder to select the word lines in response to the decoded count value; and a column selecting unit to select the bit lines in response to the decoded count value, wherein a defect cell address of the redundant cell array is transmitted to the bit lines.

15. A memory device comprising:

a memory cell array in which a plurality of memory cells are arranged to be divided into a normal cell array and a redundant cell array, the redundant cell array being configured to store defect cell information of memory cells of the memory cell array;

a repair circuit unit to detect a defect cell during a packaging process to generate the defect cell information of the defect cell; and a fuse circuit unit connected to the memory cell array and comprising a storage unit that is programmed according to the defect cell information of the memory cells of the memory cell array, wherein the repair circuit unit comprises:

a first register to store a command and first data, which are applied from an outside of the memory device;

a second register to store an address applied from the outside of the memory device and second data read from a memory cell corresponding to the address from the memory cell array;

a comparer to compare the first data with the second data and to generate a flag signal indicating that the memory cell is a defect cell; and a repair controller to store the defect cell information in the redundant cell array in response to the flag signal, and to generate an internal command signal and sequentially generate a count value from a counter in response to the command.

16. The memory device of claim 15, wherein the storage unit is programmed to store the defect cell information.

17. The memory device of claim 15, wherein:

the memory cell array comprises a normal cell array and a redundant cell array;

the redundant cell array stores previous defect cell information; and the storage unit stores the defect cell information.

18. An electronic apparatus comprising a controller to control the memory device of claim 15 to read and write data in the memory cells.

* * * * *